United States Patent

Healey

[15] 3,668,539

[45] June 6, 1972

[54] LOW LEVEL AMPLIFIER

[72] Inventor: Robert Joseph Healey, Morris Township, Morris County, N.J.

[73] Assignee: Bell Telephone Laboratories, Incorporated, Murray Hill, N.J.

[22] Filed: July 29, 1970

[21] Appl. No.: 59,251

[52] U.S. Cl. ..................................330/17, 330/19, 330/38 M
[51] Int. Cl. ...........................................................H03f 3/18
[58] Field of Search...........................330/17, 19, 38 R, 38 M

[56] References Cited

UNITED STATES PATENTS

| | | | |
|---|---|---|---|
| 3,217,175 | 11/1965 | Henness | 330/174 X |
| 3,531,730 | 9/1970 | Steckler | 330/38 M X |
| 3,531,655 | 9/1970 | Taylor | 330/38 M UX |

*Primary Examiner*—Roy Lake
*Assistant Examiner*—James B. Mullins
*Attorney*—R. J. Guenther and E. W. Adams, Jr.

[57] ABSTRACT

A low level d.c. error detector circuit wherein a semiconductor asymmetrically conducting device, such as a transistor connected as a diode, is serially connected with the low impedance signal source to be detected and the base-emitter path of the detecting transistor. The transistor-diode and the detecting transistor have the same semiconductor ratings and are poled with their forward conductivity paths connected in opposition so that the substantially equal voltages across their junctions cancel. Amplification of low level signals is thereby provided free from the non-linear effects and sensitivity of transistor junctions and without the use of a differential amplifier having two opposite polarity biasing sources.

6 Claims, 3 Drawing Figures

PATENTED JUN 6 1972 3,668,539

INVENTOR
R. J. HEALEY
BY John P. McDonnell
ATTORNEY

LOW LEVEL AMPLIFIER

BACKGROUND OF THE INVENTION

This invention relates to amplifier circuits and, more particularly, to low level d.c. amplifier circuits employed as level detectors in power regulator circuits.

Level detectors may be employed in power regulator circuits to provide a feedback regulating signal which is a sample of the current being monitored to the power regulating stage. For relatively high level sampling signals, a single transistor is employed as a detector-amplifier. For lower level sampling signals, however, the inherent forward threshold voltage (which may be 500 to 700 mv) of a transistor junction prevents the detection and amplification of samples below this level. This single transistor detector circuit also suffers from the effects of the non-linearity and temperature sensitivity of transistor junctions.

To avoid these transistor junction limitations imposed by single transistor detectors, the low level detectors of the prior art employed a two-transistor differential amplifier with both positive and negative sources of biasing potential. Since power regulators are usually connected only with the positive or negative source to be regulated and ground, this requirement of the low level differential amplifier for biasing potentials of opposite polarity normally involves the addition of a source of biasing potential other than the input source. This additional source of biasing potential increases the circuit cost and, since the output signal varies with variations in the biasing potential, decreases the accuracy of detection and regulation.

It is, therefore, an object of this invention to provide a low level d.c. amplifier-detector circuit which only requires a single polarity biasing potential.

It is a further object of this invention to provide a low level d.c. amplifier-detector circuit which is independent of variations in the biasing potential and free from the effects of the non-linearity and sensitivity of transistor junctions.

SUMMARY OF THE INVENTION

The present invention is directed to a low level d.c. level detector circuit wherein a semiconductor asymmetrically conducting device, such as a transistor connected as a diode, is serially connected with the input signal to be detected and the base-emitter path of the detecting transistor. The semiconductor asymmetrically conducting device and the level detecting transistor are chosen to have substantially identical voltage and current ratings, i.e., the same coding, but need not be matched for applications such as the negative feedback loop of a power regulator. The asymmetrically conducting device is poled for forward conduction in a direction opposite to the forward current flow through the base-emitter path of the detecting transistor to provide a voltage which is substantially opposite in sign and equal in magnitude to the forward threshold voltage of the detecting transistor. Since the base-emitter path of the detecting transistor and the forward conductivity path of the asymmetrically conducting device are serially connected, their voltage drops cancel and the capability to amplify low level signals is thereby provided. As shown algebraically hereinafter, the detected signal thus amplified is approximately proportional only to the ratio of two resistors and is free from the non-linear effects and sensitivity of the transistor junctions. In various embodiments of the invention, the sampled signal is amplified free of variations in biasing potential and of phase inversion. It should also be noted that only a single source of biasing polarity, which may be the unregulated input or regulated output voltage, is required and that a power saving in the level detector greater than an order of magnitude is obtained when the detector is used in a power regulator circuit as discussed in detail hereinafter.

BRIEF DESCRIPTION OF THE DRAWINGS

Other objects and features of the present invention will readily be apparent from the following discussion and drawings in which.

DETAILED DESCRIPTION

Figure 1:
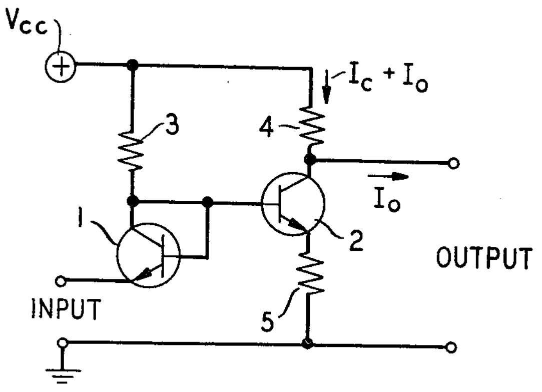
FIG. 1 is a simple embodiment of the present invention.

In FIG. 1 of the drawing, the non-grounded input terminal is connected to the emitter electrode of transistor 1, the base and collector electrodes of which are connected to the base electrode of transistor 2. Interconnecting the base and collector electrodes of transistor 1 causes the base-emitter path of this transistor to function as a diode. For reasons apparent from the following discussion, any asymmetrically conducting device having voltage and current characteristics substantially identical to the comparable voltage and current ratings of the base-emitter path of the detecting transistor may be employed in place of the transistor 1. The collector and base electrodes of transistor 1 are connected to a source of positive biasing potential $V_{cc}$ by resistor 3 to maintain a positive potential at the base and collector electrodes of this transistor. The collector electrode of transistor 2 is also connected to the source of positive biasing potential $V_{cc}$ by the resistor 4. The resistor 5 connects the emitter electrode of transistor 2 to the common grounded input-output terminal. The other output terminal is connected to the collector electrode of transistor 2. Transistors 1 and 2 are chosen to have the same ratings, i.e., are coded to be the same type but need not necessarily be matched for all applications, although, as will be apparent from the following discussion, optimum performance will be obtained when transistor 1 or an equivalent asymmetrically conducting device has matched or identical characteristics to those of the base-emitter path of transistor 2. Transistors fabricated on the same integrated circuit chip are ideal for this purpose.

The manner in which the circuit of FIG. 1 detects and amplifies low level signals or load current samples present at its input terminals will now be explained in detail. As noted, transistors 1 and 2 have the same coding or ratings, hence their base-emitter voltage drops are substantially equal for substantially equal emitter currents. Since the base-emitter junctions of transistors 1 and 2 have their forward conductivity paths poled in opposite directions relative to the input terminals, these substantially equal forward voltage drops will cancel and the entire input voltage will appear across the remaining element in the closed loop, the emitter resistor 5. Although not completely essential, if it is assumed for the sake of simplicity that the gain of the transistor is high enough so that the base-emitter current may be considered negligible, it follows then that the following relationship exists:

$$V_{in} \cong I_c R_5 \quad (1)$$

where $I_c$ is the collector-emitter current through transistor 2, $R_5$ is the resistance of the emitter resistor 5, and $V_{in}$ is the input voltage. If $I_o$ is used to designate the output current through a load connected to the output terminals, the output voltage $V_o$ may be expressed by the equation:

$$V_o = V_{cc} - R_4 (I_c + I_o) \quad (2)$$

where $V_{cc}$ is the potential of the source of positive biasing potential and $R_4$ denotes the resistance of the collector resistor 4. From equation 1 we see that $I_c = V_{in}/R_5$ and substituting into equation 2 we get:

$$V_o = V_{cc} - V_{in} R_4/R_5 - I_o R_4 . \quad (3)$$

If the input impedance of the circuit connected to the output terminals were to be constrained to be high enough then the last term in equation 3 would be ignored and the resultant output voltage $V_o$ would be equal to the voltage of the source of positive potential less the input voltage multiplied by the ratio of resistors 4 and 5. (Since resistor 4 will normally be larger than resistor 5, this ratio will be greater than one thus indicating the amplification obtained.) The output voltage would, however, still have undergone a phase inversion and vary with variations in the biasing potential $V_{cc}$. The circuit of FIG. 2 eliminates the phase inversion and output voltage variations due to variations in the biasing potential $V_{cc}$.

Figure 2:
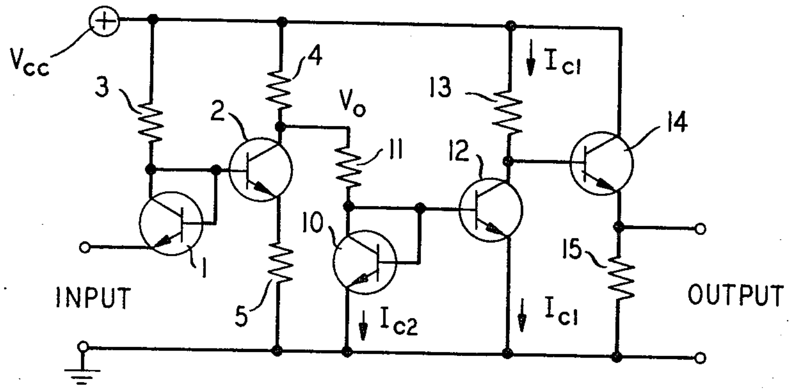
FIG. 2 is a second more detailed embodiment of the present invention operating with a source of positive biasing potential.

Before discussing the circuit of FIG. 2, however, the significance of equation 3 should be noted. Equation 3 indicates that the output voltage is free from all dependence on, or characteristics of, transistor junctions, e.g., the non-linearity and temperature sensitivity of transistor junctions. With the addition of an asymmetrically conducting device to the single transistor detector, therefore, the present invention eliminates the prior art need for a two-transistor differential amplifier with two sources of biasing potential to amplify signals having a magnitude less than the forward threshold voltage of a single transistor and, at the same time, significantly reduces the effects of the non-linearity introduced by transistor base-emitter junctions.

In the circuit of FIG. 2, additional circuitry is added at the points to which the output terminals are connected to the circuit of FIG. 1. The collector-emitter path of transistor 10 is serially connected with resistor 11 from the collector electrode of transistor 2 to the common grounded input-output terminal. Transistor 10 has its base and collector electrodes interconnected to the base electrode of transistor 12 such that transistor 10 acts as a diode, as discussed heretofore in connection with transistor 1. Transistor 10 causes the current due to the voltage $V_o$ to be transferred to the collector-emitter path of transistor 12 and, in the absence of variations of $V_o$, thereby maintain a constant current through the collector-emitter path of transistor 12. Resistor 13 is serially connected with the collector-emitter path of transistor 12 between the source of positive biasing potential $V_{cc}$ and the common grounded input-output terminal. The base-electrode of amplifier transistor 14 is connected to the collector electrode of transistor 12 and its collector-emitter path is serially connected with resistor 15 between the source of positive biasing potential $V_{cc}$ and the common grounded input-output terminal. The circuit output terminals are connected across resistor 15.

As noted heretofore, the circuit of FIG. 1 has a phase or sign inversion between the input and output voltages and variations in the biasing source voltage $V_{cc}$ will cause variations in the relationship between input and output voltages. The phase inversion and biasing potential variations are undesirable in certain applications in which the circuitry of the present invention may be employed. The circuit of FIG. 2 eliminates these disadvantages. Analyzing the circuit of FIG. 2 in the manner employed in connection with FIG. 1, an equation for the output voltage can be obtained by summing the voltages in the loop which includes the output voltage, the base-emitter path of transistor 14, resistor 13, and the source of positive biasing potential $V_{cc}$. The output voltage $V_o'$ may therefore be expressed as:

$$V_o' = V_{cc} - R_{13} I_{c1} - V_{be14} \tag{4}$$

where $V_{cc}$ is the potential of the source of positive biasing potential, $R_{13}$ is the resistance of resistor 13, $I_{c1}$ is the collector-emitter current of transistor 12 flowing through the resistor 13 (as shown on the drawing the gain of transistor 12 is assumed to be high enough so that the base current may be treated as negligible), and $V_{be14}$ is the base-emitter voltage drop across transistor 14. Since transistors 10 and 12 are chosen to have the same voltage and current ratings, the voltage drops across their base-emitter paths are substantially equal and therefore the collector currents through each of these devices are also substantially equal. These currents may be expressed as:

$$I_{c1} = I_{c2} \cong \frac{V_0 - V_{be12}}{R_{11}} \tag{5}$$

where $I_{c2}$ is the collector-emitter current through transistor 10, $V_o$ is the voltage appearing at the junction of the collector electrode of transistor 2 and resistor 4 as determined in equation 2 in connection with FIG. 1, $V_{be12}$ is the base-emitter voltage drop of transistor 12, and $R_{11}$ is the resistance of resistor 11. Combining and simplifying equations 2 and 5 to obtain $I_{c2}$ and substituting the results into equation *4* results in the following equation for the output voltage $V_o'$:

$$V_o' = V_{cc}\left(1 - \frac{R_{13}}{R_4 + R_{11}}\right) + \frac{V_{in} R_4 R_{13}}{R_5 (R_4 + R_{11})} - V_{be12}\frac{R_{13}}{R_{11}}\left(\frac{R_4}{R_4 + R_{11}} - 1\right) - V_{be14} \tag{6}$$

where $V_{be14}$ is the base-emitter voltage drop across transistor 14 and the other terms have been defined heretofore. If the resistance of resistor 13 is predetermined to be equal to the sum of the resistances of resistor 4 and resistor 11, then equation 6 simplifies to:

$$V_o' = V_{in} R_4/R_5 + V_{be12} - V_{be14} \,. \tag{7}$$

If $V_{be12}$ is assumed to be substantially equal to $V_{be14}$, then equation 7 further simplifies to:

$$V_o' = V_{in} R_4/R_5 \,. \tag{8}$$

(Since resistor 4 is generally larger than resistor 5, the ratio of these resistors will be greater than one, thus indicating the amplification obtained in the circuit.) It is important to note from equation 8 that the output voltage is related to the input voltage by the ratio of two resistor values and independent of variations in the biasing source voltage, temperature, phase inversion, and the non-linearity and sensitivity of transistor junctions. This is an ideal result.

In addition to these advantages, the use of the present circuit in the current detector stage of a power regulator results in a power savings in excess of one order of magnitude over comparable prior art circuits. For example, the single transistor current sensing circuits of the prior art typically require a signal or sample voltage in the range of one volt to overcome the transistor base-emitter threshold voltage and provide a range of adjustment. If 100 amperes were sensed, the prior art circuit would dissipate 100 watts. The circuit of FIG. 2 of the present invention would require only 5 watts to perform this same sensing function in such an application.

The assumptions and approximations made in arriving at the result of equation 8 have been found in practice to be justifiable, FOr example, although transistor leakage currents are assumed to be negligible in the foregoing analysis, this assumption is very well satisfied with small silicon transistors having currents in the nano-ampere range when they are biased to operate with collector currents in the range of 0.1 milliamperes or higher. The assumption was made that the common emitter current gains of transistors 10 and 12 were equal. It has been found that the introduction of individual resistors between the emitter electrodes of transistors 10 and 12 and the common grounded input-output terminal renders the circuit relatively insensitive to differences in gain between transistors 10 and 12 without interfering with the operation of the circuit discussed heretofore. To obtain optimum matching in gain, each of transistors 1, 2, 10, 12, and 14 of the circuit of FIG. 2 would be fabricated on the same integrated circuit chip.

Figure 3:
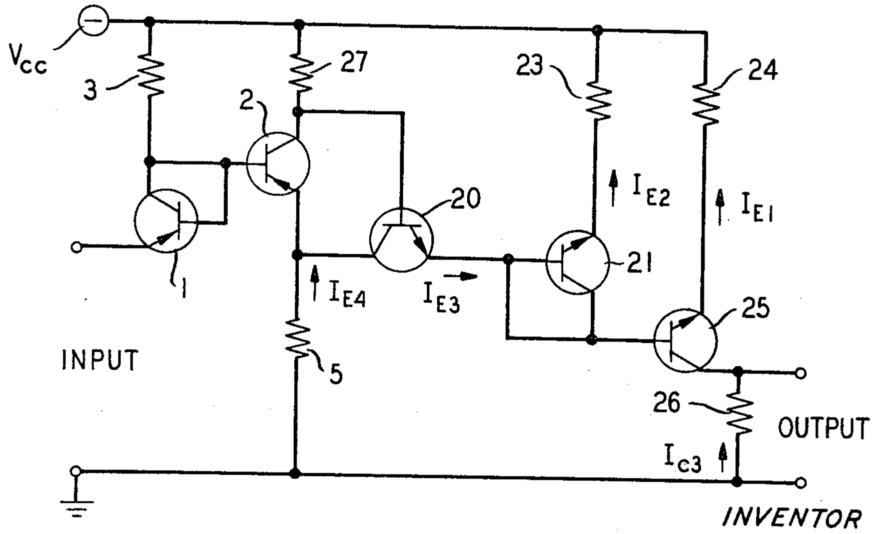
FIG. 3 is a third detailed embodiment of the present invention operating with a source of negative biasing potential.

The circuits of FIGS. 1 and 2 illustrate circuitry embodying the principles of the present invention when a source of positive biasing potential (such as the source being regulated) is available. The circuit of FIG. 3 illustrates a circuit embodying these principles having a source of negative biasing potential. As in the case of the circuit of FIG. 2, in the circuit of FIG. 3 additional circuitry is added to the circuit of FIG. 1 with the transistors 1 and 2 now being p-n-p transistors rather than n-p-n. The components of FIG. 3 which are the same as those of FIG. 1 bear the same numerical designations employed in connection with FIG. 1. In FIG. 3, the base electrode of transistor 20 is connected to the collector electrode of transistor 2, while the collector electrode of transistor 20 is connected to the emitter electrode of transistor 2. Resistor 27 connects the collector electrode of transistor 2 to the negative source of biasing potential $V_{cc}$. The base and collector electrodes of transistor 21 are connected to the emitter electrode of transistor 20. Transistor 21 causes the current $I_{e3}$ to be transferred to the base-emitter path of transistor 25 on a one-to-one basis and in the absence of variations in $I_{e3}$ maintains a constant current through the collector-emitter path of transistor 25. Resistor 23 connects the emitter electrode of transistor 21 to the negative source of biasing potential $V_{cc}$, while resistor 24 connects the emitter electrode of transistor 25 to this same source. The base electrode of transistor 25 is connected to the collector electrode of transistor 21 and resistor 26 connects the collector electrode of transistor 25 to the common grounded input-output terminal. Although the output terminals are illustrated in FIG. 3 as being connected across the resistor 26, an output may, under appropriate conditions of loading, be either alternately or concurrently taken across resistor 24.

As noted heretofore, transistors 1 and 2 are transistors having the same voltage and current ratings, i.e., of the same type or coding. Ideally, a pair of transistors fabricated on the same integrated circuit chip provide optimum performance, although separate transistors fabricated by other methods have been found to perform equally as well. The p-n-p transistors 1 and 2, if fabricated in integrated circuit form at the present state of the technology, would be "lateral" p-n-p devices which have relatively low gains. N-P-N transistor 20 is added to the circuit of FIG. 3 to compensate for this low gain.

The analysis of the operation of the circuit of FIG. 3 may be made in the same manner employed in the circuits of FIGS. 1 and 2 using many of the same assumptions which, as noted heretofore, may be shown, or have been found, to be justifiable. Treating the base currents of the transistors of FIG. 3 as negligible, and assuming that the load current is much less than the current $I_{c3}$ through resistor 26, the current $I_{c3}$ then may be treated as approximately equal to the emitter current $I_{e1}$ of transistor 25. If resistor 23 and resistor 24 are designed to be equal and transistors 21 and 25 have the same voltage and current ratings, then the emitter currents $I_{e1}$ and $I_{e2}$ may also be treated as approximately equal. Since, as discussed heretofore, transistor 21 is connected as an asymmetrically conducting device, the current input $I_{e3}$ to this transistor, which is the emitter current output of transistor 20, is approximately equal to its collector-emitter current $I_{e2}$. If resistor 4 is chosen to be large enough such that substantially all the current $I_{e4}$ through the collector-emitter path of transistor 2 flows through the collector-emitter path of transistor 20, then the collector-emitter current of transistor 20, $I_{e3}$, will be approximately equal to the collector-emitter current $I_{e4}$ through transistor 2. Summarizing these currents, we have:

$$I_{c3} \cong I_{e1} \cong I_{e2} \cong I_{e3} \cong I_{e4} . \qquad (9)$$

In connection with FIG. 1, it was determined that the current through resistor 5, in this case $I_{e4}$, was equal to the voltage input divided by the resistance of resistor 5, hence with the relationship of equation 9 we get:

$$I_{e4} \cong V_{in}/R_5 \cong I_{c3} . \qquad (10)$$

The output voltage $V_o''$ at the output terminals of the circuit of FIG. 3 may be expressed in a straightforward manner as:

$$V_o'' = R_{26} I_{c3} . \qquad (11)$$

Substituting from equation 10 the following relationship exists:

$$V_o'' = V_{in} R_{26}/R_5 \qquad (12)$$

similar to the results obtained with the circuits of FIGS. 1 and 2.

In summary, then, the present invention is a d.c. amplifier circuit wherein input signals having a magnitude less than the forward threshold voltage of a single transistor level detector are sampled and amplified independent of phase inversion, variations in, and the polarity of, the biasing potential, and free from the non-linearity and sensitivity of transistor junctions. The output voltage of the circuit for a given input voltage is readily determined by the ratio of two resistors. Recalling that the prior art circuits require a two-transistor differential amplifier and two sources of biasing potential to amplify small magnitude input signals, the economic advantages of the present invention are readily appreciated. As also noted, power savings in excess of an order of magnitude may be obtained when the circuit is employed as a current sensing detector in high power regulator circuits.

The above-described arrangement is illustrative of the application of the principles of the invention. Other embodiments may be devised by those skilled in the art without departing from the spirit and scope thereof.

What is claimed is:

1. A low level detector-amplifier circuit connected to a source of d.c. signals which vary in magnitude above and below the forward threshold voltage of a detecting transistor which comprises a first detecting transistor having its base and collector electrodes connected with a source of positive biasing potential, a first semiconductor asymmetrically conducting device having voltage and current ratings substantially the same as the voltage and current ratings of the base-emitter junction of said first detecting transistor connected to said source of positive biasing potential, means serially connecting said source of d.c. signals, said first asymmetrically conducting device, and the base-emitter path of said first detecting transistor, said first asymmetrically conducting device being poled for forward conduction in a direction opposite to the forward current flow through the base-emitter path of said first detecting transistor to provide a voltage which is substantially equal in magnitude and opposite in sign from the forward threshold voltage of said first detecting transistor, a second transistor having its base and collector electrodes connected with said source of positive biasing potential, a second semiconductor asymmetrically conducting device, means connecting said second asymmetrically conducting device and the base-emitter path of said second transistor across the collector-emitter path of said first transistor, said second asymmetrically conducting device being poled for forward conduction in a direction parallel to the forward current flow through the base-emitter path of said second transistor, and an output connected to the collector electrode of said second transistor, said input signal source and said output having a common grounded terminal, whereby input signals having a magnitude less than the forward threshold voltage of said first detecting transistor are detected and amplified independent of variations in said source of positive biasing potential.

2. A low level detector-amplifier in accordance with claim 1 wherein said first asymmetrically conducting device is a third transistor having its base and collector electrodes interconnected to said source of positive biasing potential and its emitter electrode connected to said source of input signal, the voltage and current ratings of said third transistor being substantially the same as the voltage and current ratings of said first transistor, and said second asymmetrically conducting device is a fourth transistor having its base and collector electrodes interconnected to said source of positive biasing potential and its emitter electrode connected to said common grounded terminal, said fourth transistor having voltage and current ratings substantially the same as the voltage and current ratings of said second transistor, each of said first, second, third, and fourth transistors being of the same conductivity type.

3. A low level detector amplifier in accordance with claim 13 wherein a first resistor connects the collector electrode of said first transistor to said source of positive biasing potential, a second resistor connects the emitter electrode of said first transistor to said common grounded terminal, and the output voltage is related to the input voltage by the ratio of the said first resistor to the said second resistor.

4. A low level detector-amplifier circuit connected to a source of d.c. signals which vary in magnitude above and below the forward threshold voltage of a detecting transistor which comprises a first detecting transistor having its base and collector electrodes connected with a source of negative biasing potential, a first semiconductor asymmetrically conducting device having voltage and current ratings substantially the same as the voltage and current ratings of the base-emitter junction of said first detecting transistor connected to said source of negative biasing potential, means serially connecting said source of d.c. signals, said first asymmetrically conducting device, and the base-emitter path of said first detecting transistor, said first asymmetrically conducting device being poled for forward conduction in a direction opposite to the forward current flow through the base-emitter path of said first detecting transistor to provide a voltage which is substantially equal in magnitude and opposite in sign from the forward threshold voltage of said first transistor, a second transistor having its base electrode connected to the collector electrode of said first detecting transistor and its collector electrode connected to the emitter electrode of said first detecting transistor, a third transistor having its emitter electrode connected to said source of negative biasing potential, a second semiconductor asymmetrically conducting device having voltage and current ratings substantially the same as the voltage and current ratings of the base-emitter junction of said third transistor connected with said source of negative biasing potential and the emitter electrode of said second transistor, means connecting the base electrode of said third transistor to the emitter electrode of said second transistor, means connecting the collector electrode of said third transistor to a common grounded input-output terminal, said second asymmetrically conducting device being poled for forward conduction in a direction parallel to the forward current flow through the base-emitter path of said third transistor, and a second output terminal connected to the collector electrode of said third transistor, whereby input signals having a magnitude less than the forward threshold voltage of said first detecting transistor are detected and amplified independent of variations in said source of negative biasing potential.

5. A low level detector-amplifier in accordance with claim 14 wherein said first asymmetrically conducting device is a fourth transistor having its base and collector electrodes connected to said source of negative biasing potential and its emitter electrode connected to said source of input signals, the voltage and current ratings of said fourth transistor being substantially the same as the voltage and current ratings of said first transistor, said second asymmetrically conducting device is a fifth transistor having its base and collector electrodes interconnected, said first and fourth transistors of one conductivity type and said second, third and fifth transistors being of the opposite conductivity type, and means connecting the emitter electrode of said fifth transistor to said source of negative biasing potential, said fifth transistor having voltage and current ratings substantially the same as the voltage and current ratings of said third transistor.

6. A low level detector amplifier circuit in accordance with claim 14 wherein a first resistor connects the emitter electrode of said first transistor to said common grounded input-output terminal, said means connecting the collector electrode of said third transistor to common grounded input-output terminal comprises a second resistor, and the output voltage signal is approximately equal to the input voltage signal multiplied by the ratio of the resistance of the second resistor to the resistance of the said first resistor.

* * * * *

UNITED STATES PATENT OFFICE
CERTIFICATE OF CORRECTION

Patent No. 3,668,539 Dated June 6, 1972

Inventor(s) Robert J. Healey

It is certified that error appears in the above-identified patent and that said Letters Patent are hereby corrected as shown below:

Column 4, line 29, "require" should be --required--;

line 37, the comma after "justifiable" should be a period,

"FOr" should be --For--.

Column 6, claim 3, line 1, "detector amplifier" should be --detector-amplifier--;

line 54, "13" should be --1--.

Column 8, claim 5, line 2, "14" should be --4--.

claim 6, line 1, "detector amplifier" should be --detector-amplifier--;

line 2, "14" should be --4--;

line 21, after "to" insert --said--.

Signed and sealed this 2nd day of April 1974.

(SEAL)
Attest:

EDWARD M.FLETCHER,JR.
Attesting Officer

C. MARSHALL DANN
Commissioner of Patents

FORM PO-1050 (10-69)

USCOMM-DC 60376-P69
★ U.S. GOVERNMENT PRINTING OFFICE : 1969 O—366-334.